United States Patent
Lee et al.

(10) Patent No.: US 9,425,054 B2
(45) Date of Patent: Aug. 23, 2016

(54) METHOD FOR FABRICATING SEMICONDUCTOR DEVICE

(71) Applicant: SK hynix Inc., Gyeonggi-do (KR)

(72) Inventors: Tae-Hyeok Lee, Gyeonggi-do (KR); Kyu-Tae Park, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/495,662

(22) Filed: Sep. 24, 2014

(65) Prior Publication Data

US 2015/0380253 A1    Dec. 31, 2015

(30) Foreign Application Priority Data

Jun. 26, 2014 (KR) .................... 10-2014-0078936

(51) Int. Cl.
*H01L 21/336* (2006.01)
*H01L 21/28* (2006.01)
*H01L 29/66* (2006.01)

(52) U.S. Cl.
CPC ..... *H01L 21/28247* (2013.01); *H01L 21/28185* (2013.01); *H01L 29/66621* (2013.01)

(58) Field of Classification Search
CPC ............... H01L 29/66621; H01L 21/28185; H01L 21/3003
See application file for complete search history.

(56) References Cited

U.S. PATENT DOCUMENTS

| | | | |
|---|---|---|---|
| 5,316,981 A | 5/1994 | Gardner et al. | |
| 5,731,247 A | 3/1998 | Ueno et al. | |
| 6,136,696 A * | 10/2000 | Horiba | H01L 21/76897 257/758 |
| 6,387,761 B1 * | 5/2002 | Shih et al. | 438/287 |
| 6,878,575 B2 | 4/2005 | Yoo et al. | |
| 7,166,525 B2 * | 1/2007 | Chang et al. | 438/585 |
| 7,741,202 B2 | 6/2010 | Clark | |
| 2002/0036324 A1 * | 3/2002 | Houston et al. | 257/359 |
| 2007/0287199 A1 * | 12/2007 | Hsu et al. | 438/3 |
| 2008/0261397 A1 * | 10/2008 | Yin et al. | 438/672 |
| 2009/0176342 A1 * | 7/2009 | Lee et al. | 438/270 |
| 2010/0065824 A1 * | 3/2010 | Wang et al. | 257/24 |
| 2013/0237039 A1 * | 9/2013 | Sleight et al. | 438/479 |
| 2014/0166983 A1 * | 6/2014 | Cohen et al. | 257/29 |

* cited by examiner

*Primary Examiner* — Zandra Smith
*Assistant Examiner* — John M Parker
(74) *Attorney, Agent, or Firm* — IP & T Group LLP

(57) ABSTRACT

A method for fabricating a semiconductor device includes: preparing a substrate; performing a pre-treatment including a first hydrogen annealing on a surface of the substrate; forming a gate dielectric layer over the substrate; performing a post-treatment including a second hydrogen annealing on the substrate including the gate dielectric layer; and forming a gate electrode over the gate dielectric layer.

11 Claims, 8 Drawing Sheets

US 9,425,054 B2

METHOD FOR FABRICATING SEMICONDUCTOR DEVICE

CROSS-REFERENCE TO RELATED APPLICATIONS

The present application claims priority of Korean Patent Application No. 10-2014-0078936, filed on Jun. 25, 2014, which is herein incorporated by reference in its entirety.

BACKGROUND

1. Field

Exemplary embodiments of the present invention relate to a semiconductor device fabrication technology, and more particularly, to a method for fabricating a semiconductor device including a transistor.

2. Description of the Related Art

In transistor formation, a thickness of a gate dielectric layer is being reduced to keep pace with the trend of higher integration. The reduced thickness may cause a failure on the interface between a substrate and the gate dielectric layer. The failure on the interface makes a surface of the substrate rough, which leads to voids on the interface. The voids may result in deterioration of the reliability and properties of the transistor.

SUMMARY

Exemplary embodiments are directed to a method for fabricating a semiconductor device that may eliminate failures from the interface between the substrate and the gate dielectric layer.

In accordance with an embodiment, a method for fabricating a semiconductor device includes: preparing a substrate; performing a pre-treatment including a first hydrogen annealing on a surface of the substrate; forming a gate dielectric layer over the substrate; performing a post-treatment including a second hydrogen annealing on the substrate including the gate dielectric layer; and forming a gate electrode over the gate dielectric layer.

In accordance with another embodiment, a method for fabricating a semiconductor device includes: preparing a substrate; performing a pre-treatment including a first hydrogen annealing on a surface of the substrate; forming a first gate dielectric layer over the substrate; performing an intermediate process including a second hydrogen annealing on the substrate including the first gate dielectric layer; forming a second gate dielectric layer over the first gate dielectric layer; performing a post-treatment including a third hydrogen annealing on the substrate including the first gate dielectric layer; and forming a gate electrode over the second gate dielectric layer.

DETAILED DESCRIPTION

Figure 1:
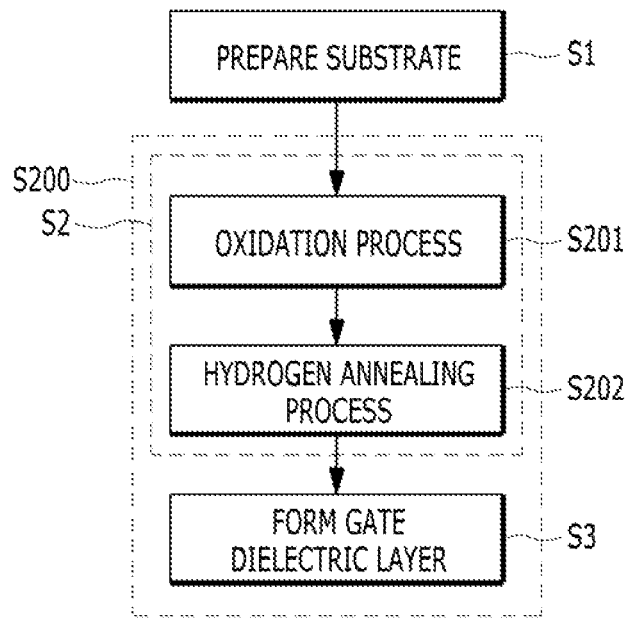
FIG. 1 is a flowchart describing a method for forming a gate dielectric layer in accordance with a first embodiment.

Various examples and implementations are described below in detail with reference to the accompanying drawings. The drawings may not be necessarily to scale and, in some instances, proportions of structures in the drawings may have been exaggerated in order to clearly illustrate certain features of the described examples or implementations. In presenting a specific example in a drawing or description having two or more layers in a multi-layer structure, the relative positioning of such layers or the sequence of arranging the layers may reflect a particular implementation for the described or illustrated example and it should be understood that a different relative positioning relationship or sequence of arranging the layers may be possible. In addition, a described or illustrated example of a multi-layer structure may not reflect all layers present in that particular multilayer structure. That is, one or more additional layers may be present between two illustrated layers. As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
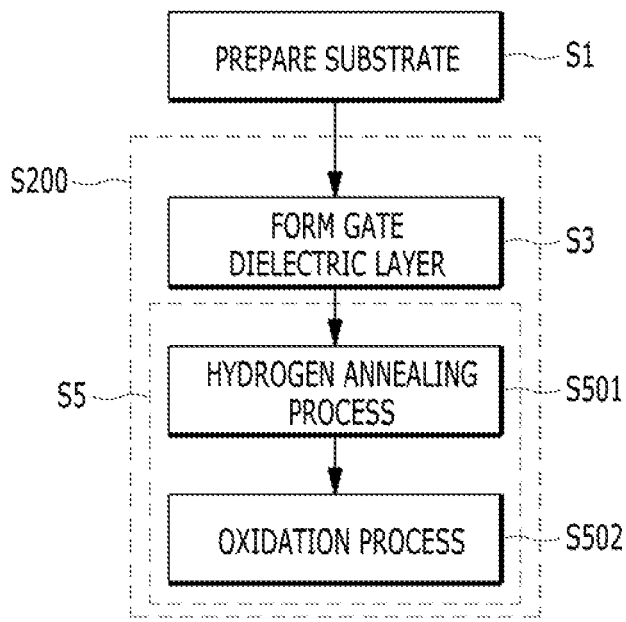
FIG. 2 is a flowchart describing a method for forming a gate dielectric layer in accordance with a second embodiment.
Figure 3:
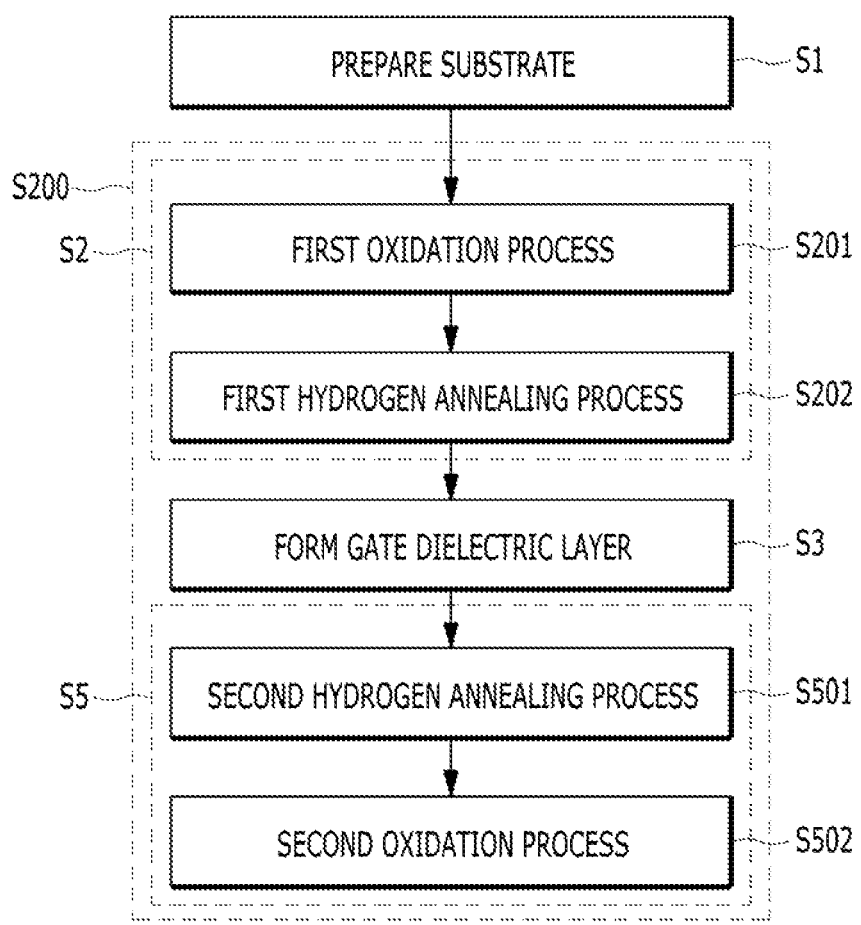
FIG. 3 is a flowchart describing a method for forming a gate dielectric layer in accordance with a third embodiment.
Figure 4:
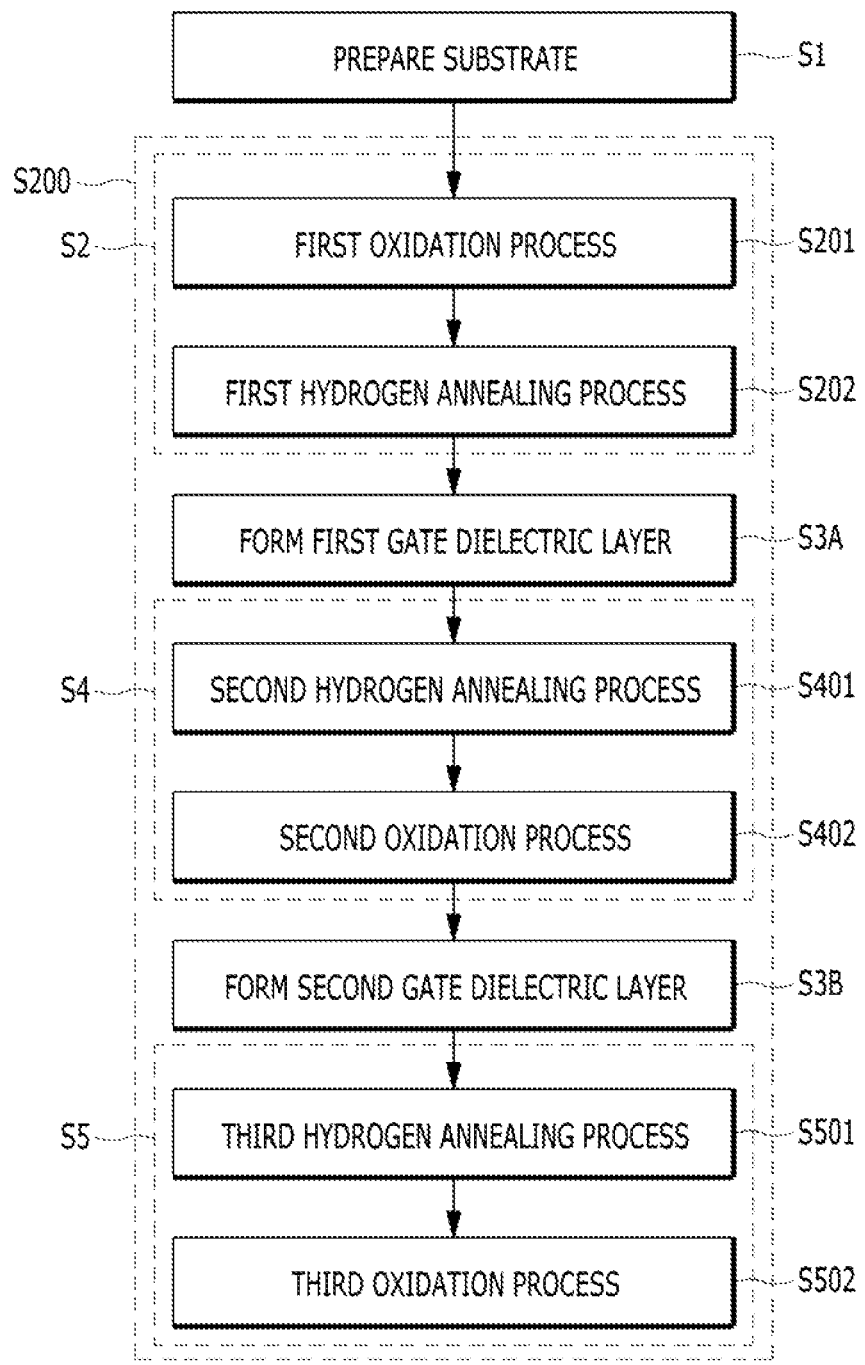
FIG. 4 is a flowchart describing a method for forming a gate dielectric layer in accordance with a fourth embodiment.

FIG. 1 is a flowchart describing a method for forming a gate dielectric layer in accordance with a first embodiment. FIG. 2 is a flowchart, describing a method for forming a gate dielectric layer in accordance with a second embodiment. FIG. 3 is a flowchart describing a method for forming a gate dielectric layer in accordance with a third embodiment. FIG. 4 is a flowchart describing a method for forming a gate dielectric layer in accordance with a fourth embodiment.

Referring to FIG. 1, a method of forming a gate dielectric layer in accordance with the first embodiment may include preparing a substrate in step S1, performing a pre-treatment in step S2, and forming a gate dielectric layer in step S3.

Referring to FIG. 2, a method of forming a gate dielectric layer in accordance with the second embodiment may include preparing a substrate in step S1, forming a gate dielectric layer in step S3, and performing a post-treatment in step S5.

Referring to FIG. 3, a method of forming a gate dielectric layer in accordance with the third embodiment may include preparing a substrate in step S1, performing a pre-treatment in step S2, forming a gate dielectric layer in step S3, and performing a post-treatment in step S5.

Referring to FIG. 4, a method of forming a gate dielectric layer in accordance with the fourth embodiment includes preparing a substrate in step S1, performing a pre-treatment in step S2, forming a first gate dielectric layer in step S3A, performing an intermediate process in step S4, forming a second gate dielectric layer in step S3B, and performing a post-treatment in step S5. Since the step S4 of performing the intermediate process has the same flow as the step S5 of performing the post-treatment, which is to be subsequently described, a detailed description on step S4 is omitted for the sake of brevity.

Referring to FIGS. 1 to 4, the step S2 of performing the pre-treatment is carried out before the step S3 of forming the gate dielectric layer in the first embodiment. The step S5 of performing the post-treatment is carried out after the step S3 of forming the gate dielectric layer in the second embodiment. The step S3 of forming the dielectric layer is carried out between the step S2 of performing the pre-treatment and the step S5 of performing the post-treatment in the third embodiment. The step S3A of forming the first gate dielectric layer is carried out between the step S2 of performing the pre-treatment and the step S4 of performing the intermediate process. The step S3B of forming the second gate dielectric layer is carried out between the step S4 of performing the intermediate process and the step S5 of performing the post-treatment in the fourth embodiment.

The step S2 of performing the pre-treatment, the step S4 of performing the intermediate process and the step S5 of performing the post-treatment may be carried out in-situ S200 with the step S3 of forming the gate dielectric layer. For example, the substrate is loaded in a chamber where the gate dielectric layer is to be formed. Subsequently, the step S2 of performing the pre-treatment is carried out in-situ S200 before the step S3 of forming the gate dielectric layer. The step S5 of performing the post-treatment is carried out in-situ S200 after the step S3 of forming the gate dielectric layer. The step S2 of performing the pre-treatment is carried out in-situ S200 before the step S3 of forming the gate dielectric layer, and the step S5 of performing the post-treatment is carried out in-situ S200 after the step S3 of forming the gate dielectric layer. The step S4 of performing the intermediate process is carried out in-situ S200 while the gate dielectric layer is formed.

The step S2 of performing the pre-treatment, the step S4 of performing the intermediate process and the step S5 of performing the post-treatment are carried out for eliminating a failure occurring on the interface between the substrate and the gate dielectric layer.

Hereafter, the step S2 of performing the pre-treatment, the step S4 of performing the intermediate process and the step S5 of performing the post-treatment are described in detail. Since the step S4 of performing the intermediate process has the same flow as the step S5 of performing the post-treatment, a detailed description on the step S4 is omitted herein.

The step S2 of performing the pre-treatment may include performing an oxidation treatment in step S201 and performing a hydrogen annealing in step S202. The step S201 of performing the oxidation treatment and the step S202 of performing the hydrogen annealing may be carried out one time or several times repeatedly. For example, the step S202 of performing the hydrogen annealing may be carried out after the step S201 of performing the oxidation treatment.

The step S201 of performing the oxidation treatment is a step for forming a sacrificial oxide layer on a surface of the substrate. In other words, the sacrificial oxide layer is formed on the surface of the substrate in order to reduce the surface roughness by eliminating a failure on the surface of the substrate. The step S201 of performing the oxidation treatment may include a plasma oxidation treatment or a thermal oxidation treatment. The step S201 of performing the oxidation treatment may be carried out using one or more reaction gases among oxidation gases such as $O_2$, $O_3$ and $H_2O$.

The step S202 of performing the hydrogen annealing is a step for eliminating the sacrificial oxide layer. In other words, the sacrificial oxide layer is eliminated through a reduction reaction as the hydrogen annealing is performed on the sacrificial oxide layer formed in the upper portion of the substrate. The step S202 of performing the hydrogen annealing may be referred to as a post-annealing. The step S202 of performing the hydrogen annealing may include a Rapid Thermal Process (RTP) or a plasma treatment. The sacrificial oxide layer may be eliminated using a reactant in the step S202 of performing the hydrogen annealing. Herein, the reactant may include a reductant or a reduction gas. The reactant may include a hydrogen-containing material such as $H_2$ or $D_2$. When the step S202 of performing the hydrogen annealing is carried out using the hydrogen-containing material, oxygen contained in the sacrificial oxide layer is eliminated through the reduction reaction, and then the sacrificial oxide layer may be eliminated. Silicon (Si) atoms migrate to a stable energy state. Thus, crystallization of silicon atoms occurs in such a manner that the silicon atoms are stably combined with each other leaving the surface of the substrate may be in a good condition.

When the step S3 of forming the gate dielectric layer is carried out after the step S201 of performing the oxidation treatment and the step S202 of performing the hydrogen annealing are carried out one time or several times repeatedly as described above, a failure on the interface between the substrate and the gate dielectric layer may be eliminated, and consequently transistor properties may be improved. For example, etch damage is eliminated hydrogen annealing from the surface of the substrate, to which an etch process is performed to form a trench, etc., during the step S201 of performing the oxidation treatment and the step S202 of performing the hydrogen annealing.

The step S5 of performing the post-treatment may include performing a hydrogen annealing process in step S501 and performing an oxidation treatment in step S502 which may be carried out one time or several times repeatedly. For example, the step S502 of performing the oxidation treatment may be carried out after the step S501 of performing the hydrogen annealing.

The step S501 of performing the hydrogen annealing is for decreasing dangling bonds. In other words, silicon dangling bonds existing on the interface between the substrate and the gate dielectric layer are decreased as the hydrogen annealing is performed on the substrate and the gate dielectric layer formed in the upper portion of the substrate. The step S501 of performing the hydrogen annealing may be referred to as a pre-annealing. The step S501 of performing the hydrogen annealing may include a Rapid Thermal Process (RTP) or a plasma treatment. The dangling bonds may decrease using a reactant in the step S501 of performing the hydrogen annealing. The reactant may include a hydrogen-containing material such as $H_2$ or $D_2$. When the step S501 of performing the hydrogen annealing is carried out using the hydrogen-containing material, the silicon dangling bond existing on the interface between the substrate and the gate dielectric layer is passivated with hydrogen. Thus, the silicon dangling bonds existing on the interface between the substrate and the gate dielectric layer are decreased.

However, when the step S501 of performing the hydrogen annealing is excessively carried out, oxygen may flow out of the gate dielectric layer. For this reason, an oxygen vacancy failure may occur in a space inside the gate dielectric layer where the oxygen flows out. To solve this problem, the oxidation treatment is performed.

The step S502 of performing the oxidation treatment is a step for eliminating an oxygen vacancy failure. In other words, the oxygen vacancy failure occurring inside the gate dielectric layer is eliminated as the oxidation treatment is performed on the gate dielectric layer. The step S502 of performing the oxidation treatment may include a plasma oxidation treatment or a thermal oxidation treatment. The step S502 of performing the oxidation treatment may be carried out using one or more reaction gases among oxidation gases such as $O_2$, $O_3$ and $H_2O$. When the step S502 of performing the oxidation treatment is carried out using the oxidation gases, the oxygen vacancy failure may be eliminated as the oxidation gases are injected to fill the vacancy of the gate dielectric layer.

When the step S501 of performing the hydrogen annealing and the step S502 of performing the oxidation treatment are carried out one time or several times repeatedly after the step S3 of forming the gate dielectric layer as described above, the failure on the interface between the substrate and the gate dielectric layer which is caused by the etch process may be eliminated, and then the properties of a transistor may be improved. The properties of the transistor may be improved since the interface condition between the substrate and the gate dielectric layer may improve. For example, etch damage is eliminated as the step S501 of performing the hydrogen annealing and the step S502 of performing the oxidation treatment are carried out on the surface of the substrate where an etch process is performed to form a trench, etc. and the gate dielectric layer formed over the substrate. The gate dielectric layer may include silicon oxide, silicon nitride, silicon oxynitride, high-k material, or a combination thereof. The high-k material may have a dielectric constant (high-k) which is higher than that of silicon oxide and silicon nitride. The high-k material may include $SiO_2$, $HfO_2$, HfSiO, HfSiON, or a combination thereof.

A method for fabricating a transistor is described hereafter. FIGS. 5A to 5G are cross-sectional views exemplarily illustrating a method for fabricating a semiconductor device in accordance with the third embodiment.

Figure 5A:
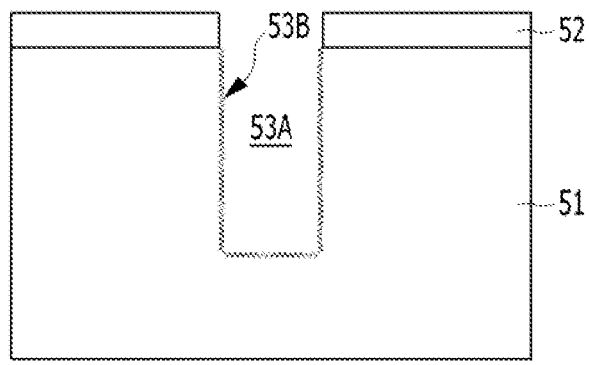
FIGS. 5A to 5G are cross-sectional views exemplarily illustrating a method for fabricating a semiconductor device in accordance with the third embodiment.

Referring to FIG. 5A, a trench 53A is formed in a substrate 51. The substrate 51 may include a silicon substrate or Silicon On Insulator (SOI) substrate. A mask pattern 52 is formed over the substrate 51, and the trench 53A may be formed through an etch process using the mask pattern 52 as an etch mask. The roughness of a trench surface 53B formed through the etch process is severe. When the gate dielectric layer is formed in a subsequent process in the trench 53A while the roughness of the trench surface 53B remains severe, a failure occurs on an interface between the trench 53A and the gate dielectric layer, and thus the properties of the transistor deteriorate. Hereafter, a method for eliminating the failure occurring on the interface between the trench 53A and the gate dielectric layer is described in detail.

Figure 5B:
Figure 5B:
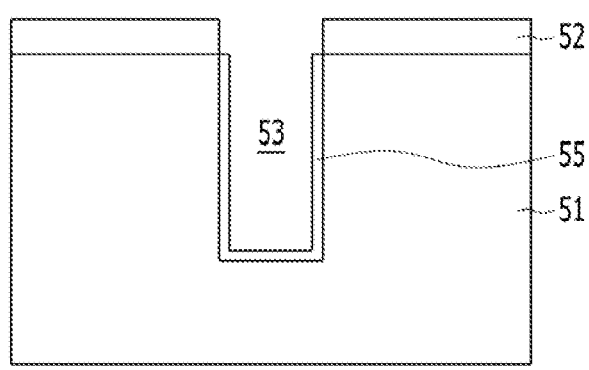
Figure 5C:
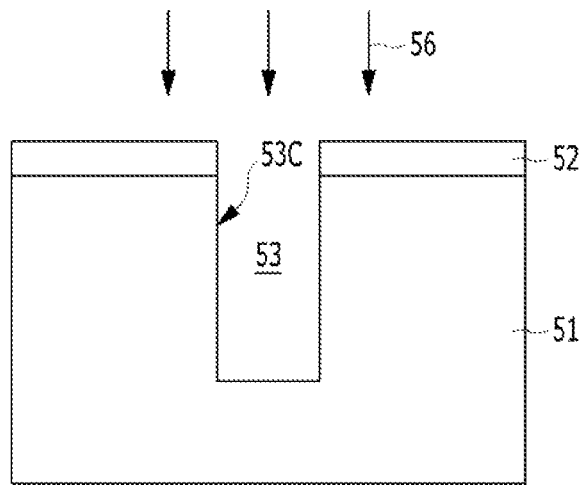

Referring to FIGS. 5B and 5C, a pre-treatment is performed. The pre-treatment may eliminate the defect occurring on the interface between the trench 53A and the gate dielectric layer which is formed through a subsequent process by sequentially performing a first oxidation treatment 54 and a first hydrogen annealing 56.

As illustrated in FIG. 5B, the first oxidation treatment 54 is performed on the surface of the trench 53A. The surface of the trench 53A is oxidized, and then a sacrificial oxide layer 55 is formed through the first oxidation treatment 54. The sacrificial oxide layer 55 may be formed to level the trench surface 53B during the subsequent first hydrogen annealing. The sacrificial oxide layer 55 may include a plasma oxidation treatment or a thermal oxidation treatment. The first oxidation treatment 54 may be performed using one or more reaction gases among oxidation gases such as $O_2$, $O_3$ and $H_2O$.

As illustrated in FIG. 5C, the first hydrogen annealing 56 is performed. The sacrificial oxide layer 55 is eliminated through the first hydrogen annealing 56. In other words, the sacrificial oxide layer 55 is eliminated through a reduction reaction as the first hydrogen annealing 56 is performed on the sacrificial oxide layer 55. The first hydrogen annealing 56 may be performed in-situ with the first oxidation treatment. That is, the first oxidation treatment 54 and the first hydrogen annealing 56 can be performed in the same chamber. The two processes 54 and 56 can be performed in a continuous manner in the same chamber without a substantial break between the two processes. The first hydrogen annealing 56 may be referred to as a post-annealing. The first hydrogen annealing 56 may include a Rapid Thermal Process (RTP) or a plasma treatment. The first hydrogen annealing 56 may eliminate the sacrificial oxide layer 55 by using a reactant. The reactant may include a reductant or a reduction gas. The reactant may include a hydrogen-containing material such as $H_2$, $D_2$, or a combination thereof. When the first hydrogen annealing 56 is performed using the hydrogen-containing material, oxygen contained in the sacrificial oxide layer 55 is eliminated through the reduction reaction, and then the sacrificial oxide layer 55 may be eliminated. Silicon (Si) atoms which are distributed on the trench surface 53B migrate to have a stable energy state. Thus, crystallinity of the silicon atoms is improved, and so the trench surface 53B may be relatively smooth.

Since defects occurring on the trench surface 53B may be eliminated when the first oxidation treatment 54 and the first hydrogen annealing 56 are performed one time or several times repeatedly as described above, the roughness of a trench surface 53C is decreased. For example, etch damage is eliminated as the first oxidation treatment 54 and the first hydrogen annealing 56 are performed on the trench surface which is damaged through an etch process for forming the trench 53 in the substrate 51.

Figure 5D:
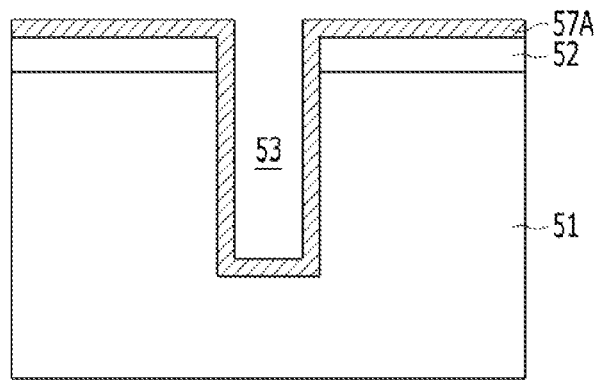

Referring to FIG. 5D, a gate dielectric layer 57A is formed over the structure including the trench 53. For example, the gate dielectric layer 57A may be formed along a contour of the trench 53. The gate dielectric layer 57A may be formed through a thermal oxidation treatment or a plasma oxidation treatment. The gate dielectric layer 57A may include silicon oxide, silicon nitride, silicon oxynitride, a high-k material, or a combination thereof. The high-k material may have a dielectric constant (high-k) which is higher than that of silicon oxide and silicon nitride. The high-k material may include $SiO_2$, $HfO_2$, HfSiO, HfSiON, a combination thereof, etc.

Figure 5E:
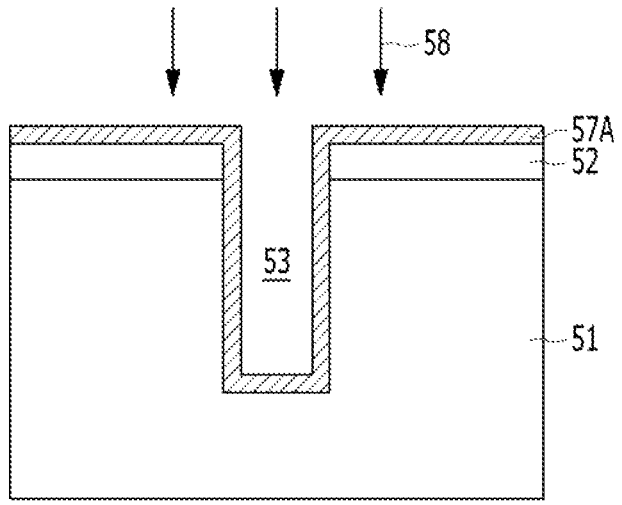
Figure 5F:
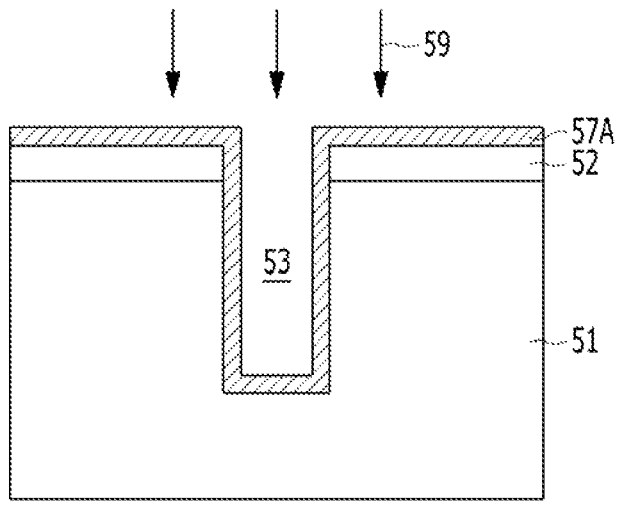

Referring to FIGS. 5E and 5F, a post-treatment is performed. The post-treatment strengthens interface stability between the trench 53 and the gate dielectric layer 57A by sequentially performing a second hydrogen annealing 58 and a second oxidation treatment 59.

As described in FIG. 5E, the second hydrogen annealing 58 is performed on the gate dielectric layer 57A. The second hydrogen annealing 58 is a process for reducing silicon dangling bonds. In other words, the silicon dangling bonds existing on the interface between the substrate 51 and the gate dielectric layer 57A are reduced as the second hydrogen annealing 58 is performed on the gate dielectric layer 57A formed in the trench 53. The second hydrogen annealing 58 may be referred to as a pre-annealing. The second hydrogen annealing 58 may include a Rapid Thermal Process (RTP) or a plasma treatment. The second hydrogen annealing 58 may reduce the silicon dangling bonds by using a reactant. The reactant may include a hydrogen-containing material such as $H_2$, $D_2$, or a combination thereof. When the second hydrogen annealing 58 is performed using the hydrogen-containing material, the silicon dangling bonds existing on the interface between the substrate 51 and the gate dielectric layer 57A are passivated with hydrogen. Therefore, the silicon dangling bonds existing on the interface between the substrate 51 and the gate dielectric layer 57A are reduced, and interface stability between the substrate 51 and the gate dielectric layer 57A may be strengthened.

However, when the second hydrogen annealing 58 is excessively performed, oxygen may flow out of the gate dielectric layer 57A. For this reason, an oxygen vacancy failure may occur inside the gate dielectric layer 57A where the oxygen flows out. To address this issue, the second oxidation treatment 59 is performed.

As illustrated in FIG. 5F, the second oxidation treatment 59 is performed over the structure including the gate dielectric layer 57A. The second oxidation treatment 59 is a process for eliminating oxygen vacancy in the gate dielectric layer 57A. In other words, the oxygen vacancy in the gate dielectric layer 57A is filled by oxygen supplied during the second oxidation treatment 59. The second oxidation treatment 59 may include a plasma oxidation treatment or a thermal oxidation treatment. The oxidation treatment may be performed using one or more reaction gases among oxidation gases such as $O_2$, $O_3$, $H_2O$, and a combination thereof. When the second oxidation treatment 59 is performed, the oxygen vacancy may be eliminated as the oxidation gases are injected into and fill the vacancy of the gate dielectric layer 57A.

Figure 5G:
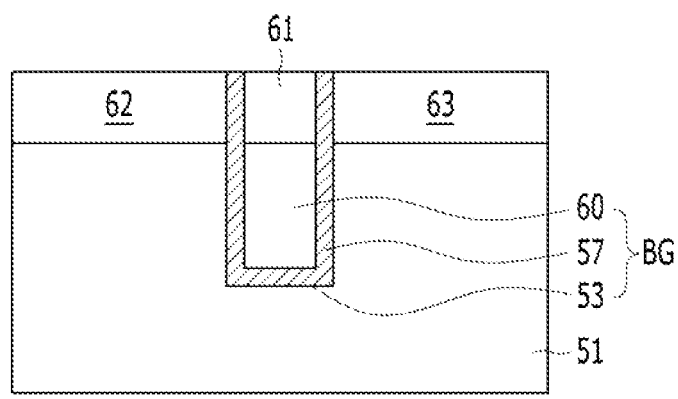

Referring to FIG. 5G, a gate conductive layer is formed over the gate dielectric layer to fill the trench 53. The gate conductive layer may include a metal-containing layer. The metal-containing layer may include a material of which the major component is a metal such as titanium, tantalum, tungsten, etc. For example, the metal-containing layer may include tantalum nitride (TaN), titanium nitride (TiN), tungsten nitride (WN), tungsten (W) or a combination thereof.

Subsequently, a first planarization process is performed on the gate conductive layer until the mask pattern 52 is exposed. The first planarization process may be performed using a chemical mechanical polishing (CMP) process. The gate dielectric layer 57A formed over the upper portion of the mask pattern 52 may be removed through the first planarization process.

Subsequently, a recessing process is performed so that the gate conductive layer remains inside the trench 53. The recessing process includes an etch-back process. A gate electrode 60 is formed through the recessing process.

As described above, a buried gate BG is formed in the trench 53. The buried gate BG includes a gate dielectric layer 57 and the gate electrode 60.

A capping layer 61 is formed over the buried gate BG. The capping layer 61 includes silicon nitride. The silicon nitride is formed over the buried gate BG to gap-fill the trench 53.

Subsequently, a second planarization process is performed until the surface of the substrate is exposed so that the silicon nitride remains in the trench 53. The planarization process may be performed using the chemical mechanical polishing (CMP) process. The mask pattern 52 formed over the substrate 51 may be removed through the second planarization process.

An ion-implantation process is performed on the substrate 51 which is exposed on both sides of the buried gate BG. A first impurity region 62 and a second impurity region 63 are formed in the substrate 51 through the ion-implantation process. The first impurity region 62 and the second impurity region 63 are the regions doped with conductive impurities. For example, the conductive impurities may include phosphorus (P), arsenic (As), antimony (Sb) or boron (B). The first impurity region 62 and the second impurity region 63 are doped with the impurities of the same conductivity. The first impurity region 62 and the second impurity region 63 correspond to a source region and a drain region, respectively.

As described above, as the pre-treatment is performed before the gate dielectric layer 57 is formed, etch damage of the trench surface may be cured. Also, as the post-treatment is performed after the gate dielectric layer 57 is formed, interface stability between the substrate 51 and the gate dielectric layer 57 may be strengthened. Therefore, the properties of the transistor may be improved since defects occurring on the interface between the substrate 51 and the gate dielectric layer 57 may be eliminated.

Figure 6:
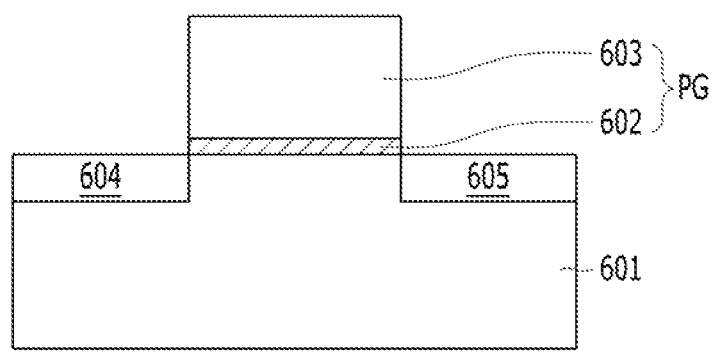
FIG. 6 is a cross-sectional view illustrating a planar gate structure in accordance with the embodiments.

FIG. 6 is a cross-sectional view illustrating a planar gate structure in accordance with an embodiment.

Referring to FIG. 6, a substrate 601 is prepared. The substrate 601 includes a semiconductor substrate. The substrate 601 may include a silicon substrate or a Silicon On Insulator (SOI) substrate.

A gate dielectric layer 602 is formed over the substrate 601. The gate dielectric layer 602 may include, for example, silicon oxide, silicon nitride, silicon oxynitride, high-k material, or a combination thereof. The high-k material may have a dielectric constant (high-k) which is higher than that of silicon oxide and silicon nitride. The high-k material may include, for example, $SiO_2$, $HfO_2$, HfSiO, HfSiON, or a combination thereof.

A gate electrode 603 is formed over the gate dielectric layer 602. The gate electrode 603 may include a metal-containing layer. The metal-containing layer may include a material of which the major component is a metal such as titanium, tantalum, tungsten, etc. For example, the metal-containing layer may include tantalum nitride (TaN), titanium nitride (TiN), tungsten nitride (WN), tungsten (W) or a combination thereof.

A planar gate PG which is a stacked structure where the date dielectric layer 602 and the gate electrode 603 are sequentially stacked over the substrate 601 may be formed.

A first impurity region 604 and a second impurity region 605 are formed in the substrate 601. The first impurity region 604 and the second impurity region 605 are disposed along with both sidewalls of the planar gate PG in the substrate 601. The first impurity region 604 and the second impurity region 605 are doped with conductive impurities. For example, the conductive impurities may include phosphorus (P), arsenic (As), antimony (Sb) or boron (B). The first impurity region 604 and the second impurity region 605 correspond to a source region and a drain region, respectively.

Figure 7:
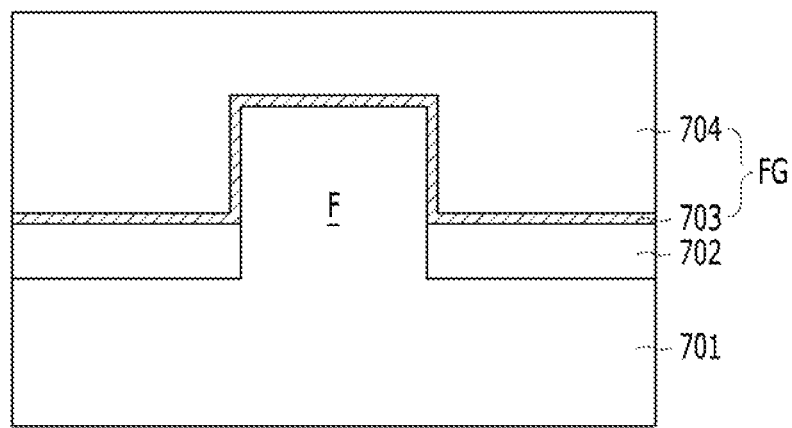
FIG. 7 is a cross-sectional view illustrating a fin gate structure in accordance with the embodiments.

FIG. 7 is a cross-sectional view illustrating a fin gate structure in accordance with an embodiment.

Referring to FIG. 7, a fin active region F is formed by selectively etching a substrate 701, and an isolation layer 702 is formed over both lower sidewalls of the fin active region F. A gate dielectric layer 703 is formed over the substrate 701 including the fin active region F. A gate electrode 704 is formed over the gate dielectric layer 703.

As described above, a fin gate FG including the gate dielectric layer 703 and the gate electrode 704 which are formed over the fin active region F may be formed.

The semiconductor device including the gates described in FIGS. 6 and 7 may be fabricated in accordance with various embodiments.

In accordance with an embodiment, defects occurring on the interface between a substrate and a gate dielectric layer may be eliminated by performing an oxidation treatment and a hydrogen annealing. The oxidation treatment and the hydrogen annealing may be performed in-situ before, after, or during the process of forming the gate dielectric layer.

It is noted that the embodiments provided herein are for describing, not limiting, the scope of the appended claims.

What is claimed is:

1. A method for fabricating a semiconductor device, comprising:
preparing a substrate;

performing a first oxidation treatment to form a sacrificial oxide layer on the surface of the substrate;

performing a first hydrogen annealing to eliminate the sacrificial oxide layer;

forming a gate dielectric layer over the substrate after the first hydrogen annealing;

performing a post-treatment including a second hydrogen annealing on the substrate including the gate dielectric layer; and forming a gate electrode over the gate dielectric layer, wherein the performing of the post-treatment further includes performing a second oxidation treatment on the gate dielectric layer after the second hydrogen annealing.

2. The method of claim 1, wherein the performing of the first oxidation treatment, the performing of the first hydrogen annealing, the performing of the second hydrogen annealing, the forming of the gate dielectric layer, and the performing of the second oxidation treatment are carried out in-situ.

3. The method of claim 1, wherein each of the first hydrogen annealing and the second hydrogen annealing is performed in an atmosphere including $H_2$, $D_2$, or a combination thereof.

4. The method of claim 1, wherein the preparing of the substrate includes forming a trench by etching the substrate.

5. A method for fabricating a semiconductor device, comprising:

preparing a substrate;

performing a pre-treatment including a first hydrogen annealing on a surface of the substrate;

forming a first gate dielectric layer over the substrate;

performing an intermediate process including a second hydrogen annealing on the substrate including the first gate dielectric layer;

forming a second gate dielectric layer over the first gate dielectric layer;

performing a post-treatment including a third hydrogen annealing on the substrate including the first and the second gate dielectric layers; and forming a gate electrode over the second gate dielectric layer.

6. The method of claim 5, wherein the performing of the pre-treatment further includes performing a first oxidation treatment before the first hydrogen annealing.

7. The method of claim 5, wherein the performing of the intermediate process further includes performing a second oxidation treatment after the second hydrogen annealing.

8. The method of claim 5, wherein the performing of the post-treatment further includes performing a third oxidation treatment after the third hydrogen annealing.

9. The method of claim 5, wherein the performing of the pre-treatment, the forming of the first gate dielectric layer, the performing of the intermediate process, the forming of the second gate dielectric layer and the performing of the post-treatment are carried out in-situ.

10. The method of claim 5, wherein the first hydrogen annealing, the second hydrogen annealing and the third hydrogen annealing are performed in an atmosphere including $H_2$, $D_2$, or a combination thereof.

11. The method of claim 5, wherein the preparing of the substrate includes forming trenches by etching the substrate.

* * * * *